United States Patent
Hsiao et al.

(10) Patent No.: US 10,276,525 B2
(45) Date of Patent: Apr. 30, 2019

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Ching-Wen Hsiao, Hsinchu (TW); Chen-Shien Chen, Hsinchu (TW); Kuo-Ching Hsu, Taipei (TW); Mirng-Ji Lii, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/452,674

(22) Filed: Mar. 7, 2017

(65) Prior Publication Data

US 2018/0151524 A1 May 31, 2018

Related U.S. Application Data

(60) Provisional application No. 62/427,138, filed on Nov. 28, 2016.

(51) Int. Cl.
*H01L 23/00* (2006.01)

(52) U.S. Cl.
CPC .............. *H01L 24/08* (2013.01); *H01L 24/13* (2013.01); *H01L 24/14* (2013.01); *H01L 24/73* (2013.01); *H01L 24/94* (2013.01); *H01L 2224/02311* (2013.01); *H01L 2224/02331* (2013.01); *H01L 2224/02373* (2013.01);

(Continued)

(58) Field of Classification Search
CPC ......... H01L 24/08; H01L 24/13; H01L 24/14; H01L 24/73; H01L 24/94; H01L 2224/02311; H01L 2224/02331; H01L 2224/02373; H01L 2224/02377; H01L 2224/02381; H01L 2224/08265; H01L 2224/13014; H01L 2224/13024; H01L 2224/14135

See application file for complete search history.

(56) References Cited

U.S. PATENT DOCUMENTS 7,838,424 B2  11/2010  Karta et al.
7,863,742 B2  1/2011  Yu et al.
(Continued)

*Primary Examiner* — Syed I Gheyas
(74) *Attorney, Agent, or Firm* — JCIPRNET

(57) ABSTRACT

A package structure is provided comprising a die, a redistribution layer, at least one integrated passive device (IPD), a plurality of solder balls and a molding compound. The die comprises a substrate and a plurality of conductive pads. The redistribution layer is disposed on the die, wherein the redistribution layer comprises first connection structures and second connection structures. The IPD is disposed on the redistribution layer, wherein the IPD is connected to the first connection structures of the redistribution layer. The plurality of solder balls is disposed on the redistribution layer, wherein the solder balls are disposed and connected to the second connection structures of the redistribution layer. The molding compound is disposed on the redistribution layer, and partially encapsulating the IPD and the plurality of solder balls, wherein top portions of the solder balls and a top surface of the IPD are exposed from the molding compound.

19 Claims, 5 Drawing Sheets

(52) U.S. Cl.
CPC .............. *H01L 2224/02377* (2013.01); *H01L 2224/02381* (2013.01); *H01L 2224/08265* (2013.01); *H01L 2224/13014* (2013.01); *H01L 2224/13024* (2013.01); *H01L 2224/14135* (2013.01); *H01L 2224/73104* (2013.01); *H01L 2924/19103* (2013.01)

(56) References Cited

U.S. PATENT DOCUMENTS

| | | |
|---|---|---|
| 7,932,601 B2 | 4/2011 | Chang et al. |
| 8,754,508 B2 | 6/2014 | Chen et al. |
| 8,772,151 B2 | 7/2014 | Chen |
| 8,846,548 B2 | 9/2014 | Tu et al. |
| 2013/0341800 A1 | 12/2013 | Tu et al. |
| 2014/0015122 A1 | 1/2014 | Chou et al. |
| 2014/0045379 A1 | 2/2014 | Chen |
| 2014/0048926 A1 | 2/2014 | Wang et al. |
| 2014/0057394 A1* | 2/2014 | Ramasamy ........... H01L 21/561 438/113 |
| 2014/0077356 A1 | 3/2014 | Chen et al. |
| 2014/0183693 A1 | 7/2014 | Tsai et al. |
| 2014/0187103 A1 | 7/2014 | Chen et al. |
| 2014/0252558 A1 | 9/2014 | Yu et al. |
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |
| 2016/0118333 A1* | 4/2016 | Lin ........................ H01L 24/97 257/773 |

* cited by examiner

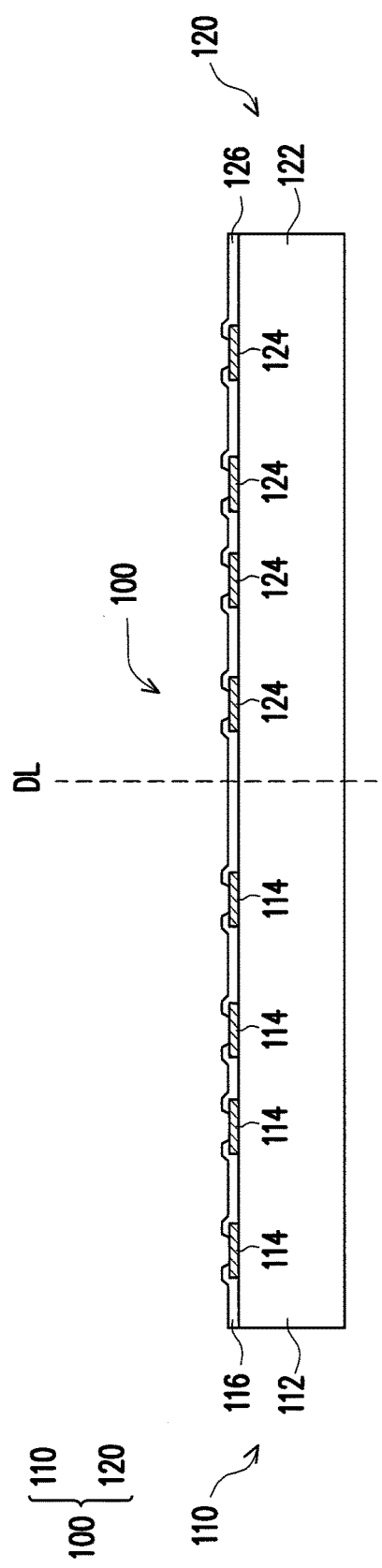
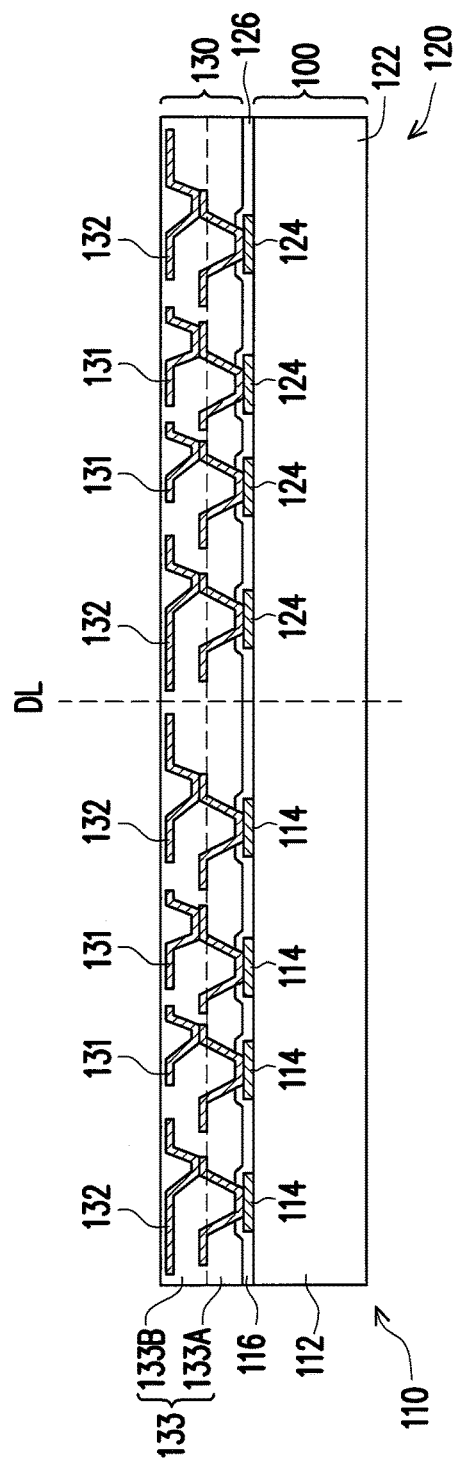

PACKAGE STRUCTURE AND METHOD OF FABRICATING THE SAME

CROSS-REFERENCE TO RELATED APPLICATION

This application claims the priority benefits of U.S. provisional application Ser. No. 62/427,138, filed on Nov. 28, 2016. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are the schematic cross-sectional views showing the package structure at various stages of the method of fabricating a package structure according to some embodiments of the present disclosure.

DETAILED DESCRIPTION

Figure 1:
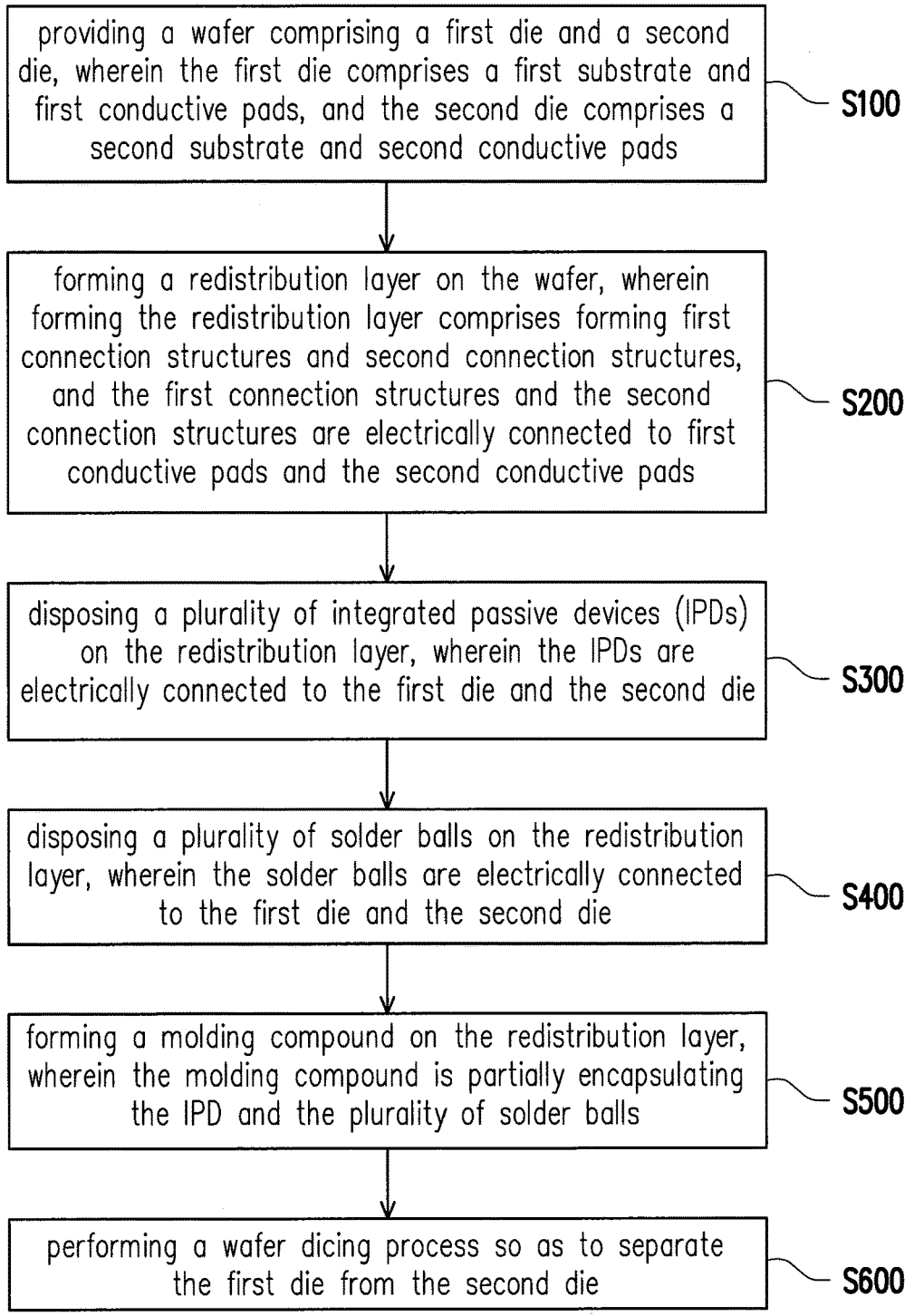
FIG. 1 is an exemplary flow chart showing the process steps of the method of fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an exemplary flow chart showing the process steps of the method of fabricating a package structure in accordance with some embodiments of the present disclosure. The various process steps of the process flow illustrated in FIG. 1 may comprise multiple process steps as discussed below. FIGS. 2A-2F are the schematic cross-sectional views showing the package structure at various stages of the method of fabricating a package structure according to some embodiments of the present disclosure. It is to be noted that the process steps described herein cover a portion of the manufacturing processes used to fabricate a package structure. The embodiments are intended to provide further explanations but are not used to limit the scope of the present disclosure.

In accordance with some embodiments, referring to step S100 in FIG. 1 and as shown in FIG. 2A, a wafer 100 comprising a first die 110 and a second die 120 is provided. In FIG. 2A, only two dies are presented for illustrative purposes, however, it should be noted that the wafer 100 may be provided with more than two dies. The die(s) described herein may be referred as a chip or an integrated circuit (IC). In some embodiments, the first die 110 comprises a first substrate 112, a plurality of first conductive pads 114 formed on the first substrate 112, and a passivation layer 116. In one embodiment, the passivation layer 116 is formed over the first substrate 112 and has a plurality of opening so as to partially expose the first conductive pads 114. In some embodiments, the second die 120 comprises a second substrate 122, a plurality of second conductive pads 124 formed on the second substrate 122, and a passivation layer 126. In one embodiment, the passivation layer 126 is formed over the second substrate 122 and has a plurality of opening so as to partially expose the second conductive pads 124. In some embodiments, the material of the passivation layer 116 is the same as that of the passivation layer 126. In some embodiments, the passivation layers 116 and 126 are formed from the same layer in the same process. In some embodiments, the first die 110 and the second die 120 are provided from the same wafer, and the first and second dies 110 and 120 are joined together but defined by the dicing line DL located there between. In some embodiments, the first die 110 and the second die 120 that are to be separated through a wafer dicing process at the dicing line DL are chips of the same type. Alternatively, the first die 110 and the second die 120 may be chips of different types.

In some embodiments, the first substrate 112 and the second substrate 122 are silicon substrates including active components (e.g., transistors, diodes, memories, optoelectronic devices or the like) and optionally passive components (e.g., resistors, capacitors, inductors, transducers, antennas or the like) formed therein. In some embodiments, the first/second substrate 112/122 includes at least one active component, and the active component may be a radio frequency application device for example, transmitters, receivers, modulators or transceivers. In certain embodiments, the first conductive pads 114 and the second conductive pads 124 are aluminum pads, copper pads or other suitable metallic pads. In some embodiments, the passivation layer 116/126 includes a silicon oxide layer, a silicon nitride layer, a silicon oxy-nitride layer or a dielectric layer formed by other suitable dielectric materials.

FIG. 2B illustrates a cross-sectional view of the package structure at one of various stages of the fabricating method. Referring to step S200 in FIG. 1 and as shown in FIG. 2B, a redistribution layer 130 is formed on the wafer 100. In some embodiments, the formation of the redistribution layer may comprise forming first connection structures 131 and second connection structures 132 within a dielectric layer 133. In some embodiments, forming the redistribution layer 130 includes forming a first dielectric layer 133A, then pattering the first dielectric layer 133 to form openings, and forming a first metal layer (used to form parts of connection structures 131/132) within the openings and then patterning the first metal layer. Thereafter, a second dielectric layer 133B is formed above the first metal layer and then patterned to form openings that expose the patterned first metal layer, and then a second metal layer (used to form parts of connection structures 131/132) is formed within the openings and then patterned. In the above embodiment, the patterned first and second metal layer form the first connection structures 131 and second connection structures 132 inlaid within the dielectric layer 133 (including the first dielectric layer 133A and the second dielectric layer 133B). However, it should be noted that the redistribution layer 130 is not limited to include two dielectric layers and/or two metal layers. In certain embodiments, the redistribution layer 130 may be made by forming one or more dielectric layers and forming one or more metal layers.

In some embodiments, the first connection structures 131 and the second connection structures 132 are physically and electrically connected to the plurality of first conductive pads 114 and the plurality of second conductive pads 124. In other words, the plurality of first conductive pads 114 and the plurality of second conductive pads 124 are in direct contact with the first connection structures 131 and the second connection structures 132. In some embodiments, the first connection structures 131 and the second connection structures 132 may be physically and electrically separate from each other, and the dielectric layer 133 sandwiched between the first connection structures 131 and the second connection structures 132 separates the first connection structures 131 and the second connection structures 132. In certain embodiments, the redistribution layer does not extend beyond the first and second dies of the wafer 100. That is, in some embodiments, the wafer 100 is a fan-in wafer and the packaging process is a part of a fan-in wafer level packaging processes.

In some embodiments, the materials of the dielectric layer 133 include one or more polymer dielectric materials such as polymide, benzocyclobutene (BCB), polybenzooxazole (PBO), or any other suitable polymer-based dielectric materials. In certain embodiments, the first connection structures 131 and the second connection structures 132 are metallization patterns, and the material of the first connection structures 131 and the second connection structures 132 includes aluminum, titanium, copper, nickel, tungsten, combinations or alloys thereof.

Figure 2C:
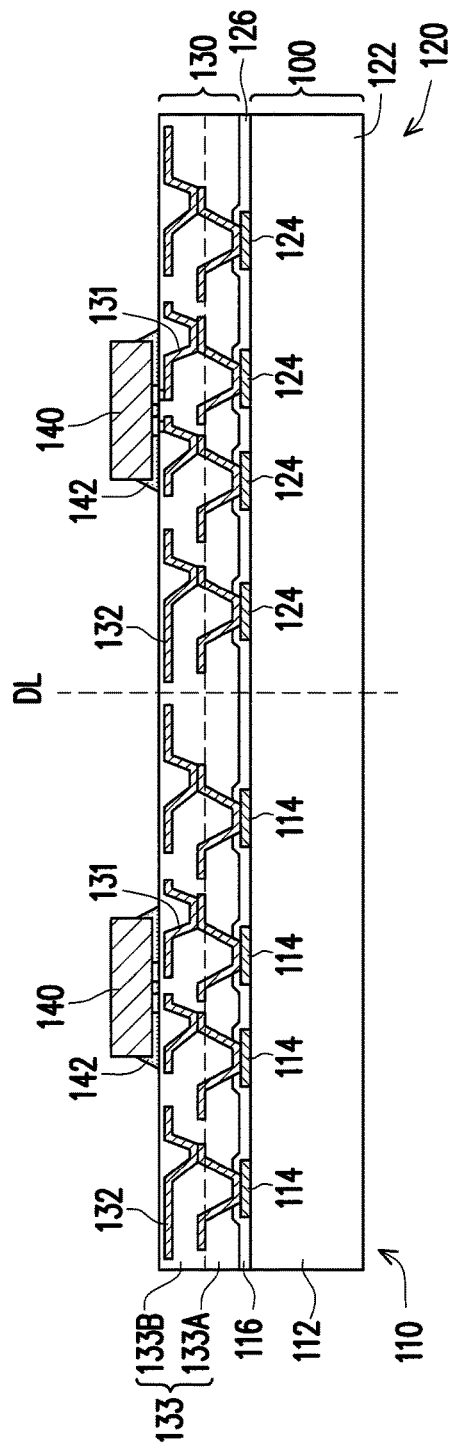

FIG. 2C illustrates a cross-sectional view of the package structure at one of various stages of the fabricating method. Referring to step S300 in FIG. 1 and as shown in FIG. 2C, a plurality of integrated passive device (IPD) 140 is disposed on the redistribution layer 130. In certain embodiments, at least one IPD 140 is disposed on the first die 110 and electrically connected to the first die 110 through the first connection structures 131 of the redistribution layer 130, or disposed on the second die 120 and electrically connected to the second die 120 through the first connection structures 131 of the redistribution layer 130. Only two IPDs 140 are presented in FIG. 2C for illustrative purposes, but the number of IPD 140 mounted on the redistribution layer 130 is not particularly limited to the embodiments and can be varied based on design requirements. In some embodiments, the IPDs 140 are, for example, capacitors, resistors, inductors, diodes and/or the like. In certain embodiments, after forming the IPD 140 on the redistribution layer 130, an underfill structure 142 is optionally formed and filled in between each of the IPD 140 and the redistribution layer 130. In some embodiments, the underfill structure 142 is located above the redistribution layer 130 and fills into the space in between the IPD 140 and the redistribution layer 130. In certain embodiments, the underfill structure 142 is made of a resin material, and a heating step is performed to cure the resin material to form the underfill structure 142. However, in other embodiments, the underfill structure 142 is omitted, and the IPD 140 may be attached onto the redistribution layer 130 without the underfill structure 142.

Figure 2D:
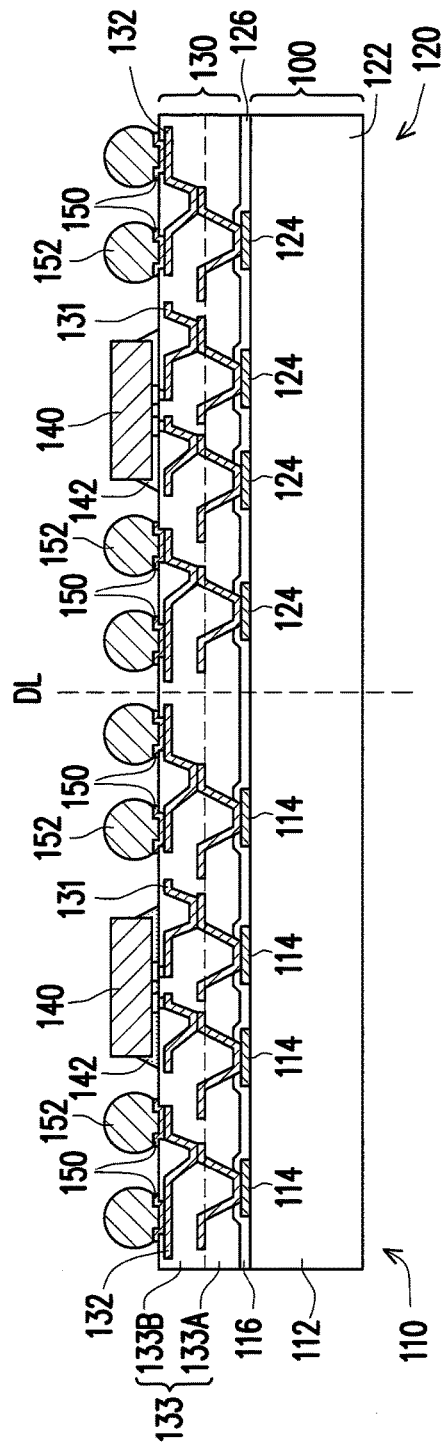

FIG. 2D illustrates a cross-sectional view of the package structure at one of various stages of the fabricating method. Referring to step S400 in FIG. 1 and as shown in FIG. 2D, a plurality of solder balls 152 is formed on the second connection structures 132 of the redistribution layer 130. In one embodiment, the solder balls 152 are disposed on the ball pads 150, so that the solder balls 152 are electrically connected to the first conductive pads 114 of the first die 110 or electrically connected to the second conductive pads 124 of the second die 120 through these ball pads 150 and the redistribution layer 130. In certain embodiments, the ball pads 150 may be formed by forming a metal material over the dielectric layer 133 and the exposed portions of the second connection structures 132 and then patterning the metal material. In some embodiments, the solder balls 152 are attached to the ball pads 150 through a solder flux. In some embodiments, the solder balls 152 are electrically connected to the first die 110 and the second die 120 through the ball pads 150 and the second connection structures 132 of the redistribution layer 130. In some embodiments, the solder balls 152 are disposed adjacent to the IPD 140. In certain embodiments, the solder balls 152 are arranged surrounding the IPD 140. In some embodiments, the materials of the ball pads 150 include copper, nickel, aluminum, tungsten or alloys thereof. In certain embodiments, the ball pads 150 include under-ball metallurgy (UBM) patterns for assisting ball mounting. The number of the ball pads 150 or under-ball metallurgy patterns is not limited by embodiments of this disclosure. Furthermore, in certain embodiments, the solder balls 150 are disposed on the redistribution layer 130 after the IPD 140 is disposed on the redistribution layer 130. However, in other embodiments, the solder balls 150 may be disposed on the redistribution layer 130 prior to disposing the IPD 140 on the redistribution layer. In other words, the order of disposing the IPD 140 and the solder balls 150 is not particularly limited.

Figure 2E:
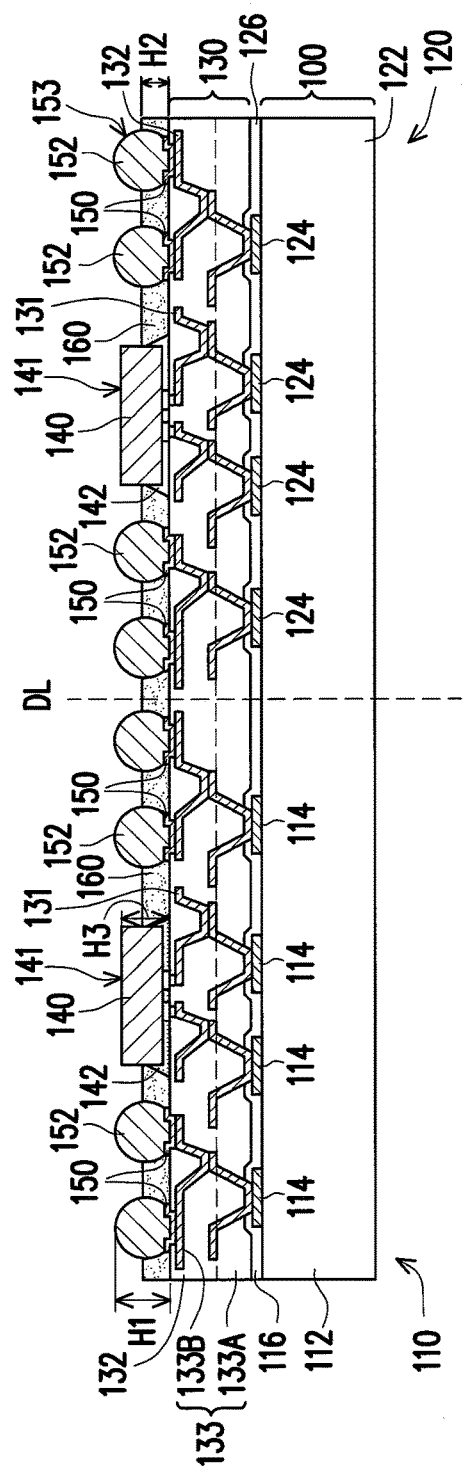

FIG. 2E illustrates a cross-sectional view of the package structure at one of various stages of the fabricating method. Referring to step S500 in FIG. 1 and as shown in FIG. 2E, a molding compound 160 is formed on the redistribution layer 130. In some embodiments, the molding compound 160 includes, for example, an epoxy resin or any other suitable type of molding materials. In some embodiments, the molding compound 160 is formed by providing and then curing a molding material over the wafer 100 to form the molding compound 160 on the redistribution layer 130, and the molding material includes epoxy resins, which is a semi-solid at high temperature. In some embodiments, the molding compound 160 has low filler contents and has low viscosity. In some embodiments, the molding compound 160 partially encapsulates the IPD 140 and the plurality of solder balls 152. In some embodiments, the molding compound 160 is formed to cover the solder balls 152 and the IPD 140 at a height no more than a half of a height of the solder balls 152. That is, in certain embodiments, if a height of the solder balls 152 is H1 (from the top surface of the redistribution layer 130) and a height of the molding compound 160 is H2 (from the top surface of the redistribution layer 130), then the height H2 is equal to or less than (H1)/2. In some embodiments, a height of the IPD 140 is H3 and a height of the molding compound 160 is H2, and the height H3 is equal to or greater than the height H2. In some embodiments, depending on the type of the IPD 140 mounted on the redistribution layer 130, the height H3 of the IPD 140 is larger than the height H2 of the molding compound 160. In certain embodiments, the molding compound 160 is formed to fill the space between the solder balls 152 and between the IPD 140 and the solder balls 152. In some embodiments, the molding compound 160 partially encapsulates the IPD 140 and the plurality of solder balls 152 but at least exposing the top surface 141 of the IPD 140 and top portions 153 (portions above the molding compound 160) of the plurality of solder balls 152.

In certain embodiments, as shown in FIG. 2E, an underfill structure 142 is optionally formed between the IPD 140 and the redistribution layer 130, the molding compound 160 also encapsulates the underfill structure 142. Furthermore, in some embodiments, the redistribution layer 130 is formed after providing the wafer 100, and the molding compound 160 is formed after forming the redistribution layer 130.

Figure 2F:
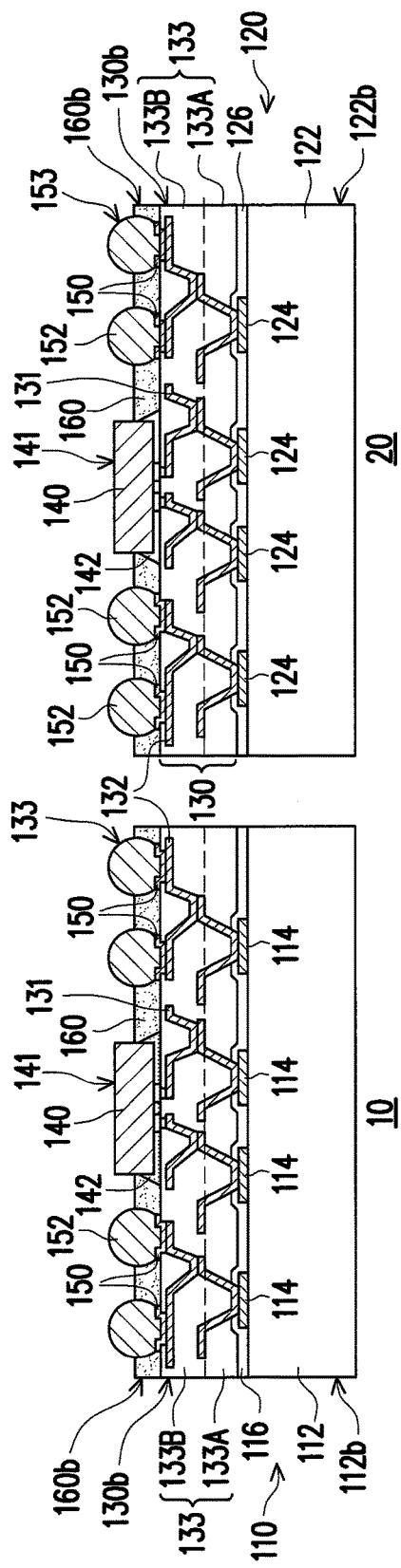

FIG. 2F illustrates a cross-sectional view of the package structure at one of various stages of the fabricating method. Referring to step S600 in FIG. 1 and as shown in FIG. 2F, in some embodiments, the method of fabricating the package structure further comprises performing a wafer dicing process at the dicing line DL after forming the molding compound 160, so as to separate the first die 110 from the second die 120. In some embodiments, the wafer dicing process is performed by cutting through the wafer 100, the redistribution layer 130 and the molding compound 160 so as to separate the structure into individual packages 10 and 20. In some embodiments, the wafer dicing process is performed to cut the packaged wafer 100 into a plurality of packages 10, 20 respectively comprising the first and second dies 110, 120 by using wafer saw technology. Alternatively, in some embodiments, the packages 10, 20 respectively comprising the first and second dies 110, 120 are separated by using laser technology and/or a wafer cutting process. In some embodiments, the manufacturing process described above is part of a wafer level packaging process. In some embodiments, the wafer level packaging process relates to a fan-in wafer level packaging process, and a plurality of fan-in packages or chip scale packages (such as package 10 and package 20) is obtained after the wafer dicing process.

As shown in FIG. 2F, in some embodiment, after cutting the molding compound 160, the redistribution layer 130 and the first/second substrate 112/122 by the wafer dicing process, the sidewalls 130b of the redistribution layer 130 and the sidewalls 160b of the molding compound 160 are substantially aligned vertically, and the sidewalls 160b of the molding compound 160 are substantially aligned with the sidewalls 112b/122b of the first/second substrate 112/122.

Figure 3A:
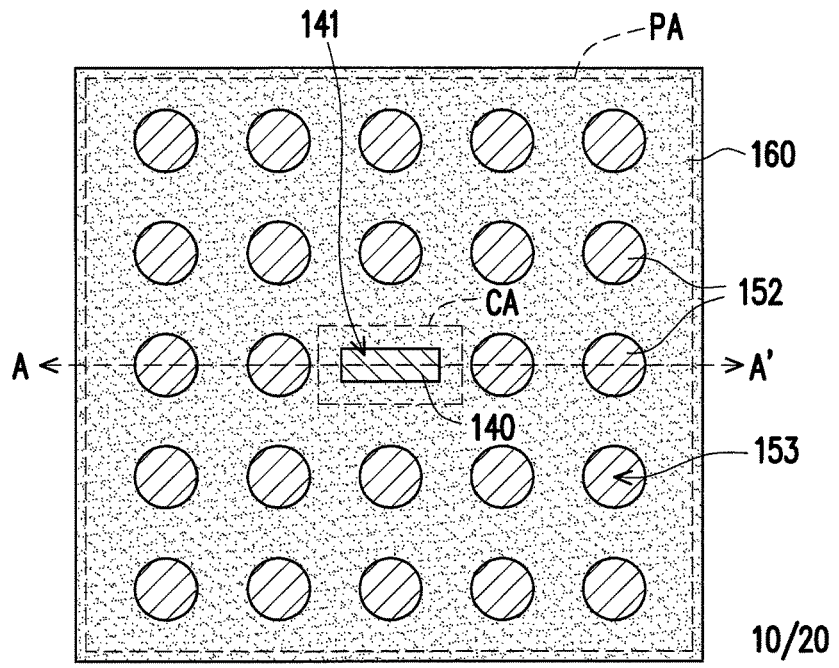
FIGS. 3A-3B are the top views showing the package structure at various stages of the method of fabricating a package structure according to some embodiments of the present disclosure.

FIG. 3A is the top view showing the package structure at various stages of the method of fabricating a package structure according to some embodiments of the present disclosure. Referring to FIG. 3A, it represents one of several embodiments of a top view of a package structure (package 10 or package 20) obtained in the step shown in FIG. 2F, wherein the package structure (10/20) obtained in FIG. 2F is for example, a sectional view taken alone line A-A' of FIG. 3A. In some embodiments as shown in FIG. 3A, the package structure (10/20) is shown to have a central area CA and a peripheral area PA. In certain embodiments, an IPD 140 is disposed in the central area CA of the package structure (10/20), whereas the plurality of solder balls 152 is disposed in the peripheral area PA of the package structure (10/20) around the central area. In certain embodiments, as shown in FIG. 3A, the IPD 140 is surrounded by the plurality of solder balls 152. In some embodiments, the IPD 140 may be placed in the central area CA at the midpoint position or epicenter positions. Furthermore, in some embodiments, from the top view as shown in FIG. 3A, the molding compound 160 is observed between each of the solder balls 152, and between the IPD 140 and the solder balls 152, exposing the top surface 141 of the IPD 140 and top portions 153 of the solder balls 152 but covering the underlying redistribution layer 130 and the substrate (112/122) of the die (110/120). That is, in such embodiments, an orthogonal projection of the molding compound 160 completely covers an orthogonal projection of the redistribution layer 130 and an orthogonal projection of the substrate (112/122) of the die (110/120). Furthermore, in some embodiments, the orthogonal projection of the molding compound 160 and that of the redistribution layer 130 are substantially coincided with the orthogonal projection of the substrate (112/122) of the die (110/120).

Figure 3B:
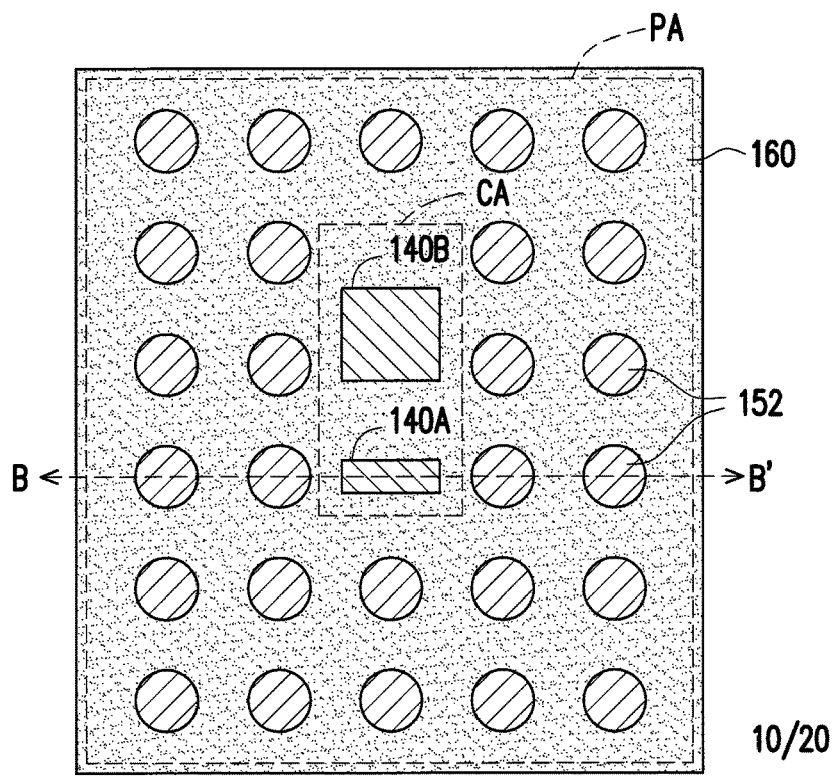

FIG. 3B is the top view showing the package structure at various stages of the method of fabricating a package structure according to some embodiments of the present disclosure. Referring to FIG. 3B, it represents one of several embodiments of a top view of a package structure (package 10 or package 20) obtained in the step shown in FIG. 2F, wherein the package structure (10/20) obtained in FIG. 2F is for example, a sectional view taken alone line B-B' of FIG. 3B. In some embodiments as shown in FIG. 3B, the package structure (10/20) is shown to have a central area CA and a peripheral area PA around the central area CA. In some embodiments, two or more IPDs may be provided. In certain embodiments, a first IPD 140A and a second IPD 140B are disposed in the central area CA of the package structure (10/20), whereas the plurality of solder balls 152 is disposed in the peripheral area PA of the package structure (10/20) and arranged around and surrounding the first and second IPDs 140A, 140B. In certain embodiments, as shown in FIG. 3B, the first and second IPDs 140A, 140B are arranged beside each other and located within the central area CA surrounding by the plurality of solder balls 152. Similar to the embodiment shown in FIG. 3A, from the top view as shown in FIG. 3B, the top surfaces of the first and second IPDs 140A, 140B and the top portions of the solder balls 152 are exposed from the molding compound 160. In some embodiments, the first and second IPDs 140A, 140B are different types of passive components. In one embodiment, the first IPD 140A includes a capacitor and the second IPD 140B includes an inductor, a resistor or even an antenna, for example. In some embodiments, the first and second IPDs 140A, 140B are the same type of passive components. In one embodiment, the first IPD 140A includes a capacitor and the second IPD 140B includes another capacitor of the same or different capacitance, for example.

From the above embodiments, it is noted that the number or type of the IPD(s) 140 disposed on the redistribution layer is not particularly limited, and can be adjusted based on design requirements. Furthermore, in some embodiments, the number of solder balls 150 is not particularly limited, and can be adjusted based on the size or layout design of the package structure (10/20).

In accordance with some embodiments in the present disclosure, compared with the area-consuming arrangement of the passive components arranged around the package die, the passive devices (IPDs) or passive components that are laid directly on the redistribution layer and integrated into the fan-in package structures just occupy little footprint area, so as to provide small footprint and compact package structures. As the IPDs or passive components are protected by the molding compound covering the redistribution layer, better connection reliability of the package structures is achieved. That is, the passive devices are packaged during the wafer level packaging process and are integrated on top (or within) of the die (wafer) to form compact package structures with better electrical properties and reliability. In such package structure designs disclosed in the present disclosure, the integrated passive device (IPD) is disposed on the redistribution layer and electrically connected to the underlying die through the first connection structures of the redistribution layer, thus providing better electrical performance with short electrical paths. In some embodiment, by integrating the passive device(s) on the die and within the package structure, the loop inductance is reduced as the IPD is arranged closer to the device within the underlying substrate. Furthermore, the passive devices (IPD) are arranged on the redistribution layer with the solder balls surrounding the passive devices, and is protected or encapsulated by the molding compound, leading to improved connection reliability.

In some embodiments of the present disclosure, a package structure is provided comprising a die, a redistribution layer, at least one integrated passive device (IPD), a plurality of solder balls and a molding compound. The die comprises a substrate and a plurality of conductive pads formed on the substrate. The redistribution layer is disposed on the die, wherein the redistribution layer comprises first connection structures and second connection structures, and the first connection structures and the second connection structures are electrically connected to the plurality of conductive pads. The at least one IPD is disposed on the redistribution layer and electrically connected to the die, wherein the at least one IPD is disposed on and connected to the first connection structures of the redistribution layer. The plurality of solder balls is disposed on the redistribution layer and electrically connected to the die, wherein the plurality of solder balls is disposed on and connected to the second connection structures of the redistribution layer. The molding compound is disposed on the redistribution layer, covering the redistribution layer and partially encapsulating the at least one IPD and the plurality of solder balls, wherein top portions of the plurality of solder balls and a top surface of the at least one IPD are exposed from the molding compound.

In some embodiments of the present disclosure, a package structure is provided comprising a die, a redistribution layer, a plurality of integrated passive devices (IPDs), a plurality of ball pads, a plurality of solder balls and a molding compound. The die comprises a substrate and a plurality of conductive pads. The redistribution layer is disposed on the die, wherein the redistribution layer comprises a dielectric layer, first connection structures and second connection structures, and the dielectric layer separates the first connection structures from the second connection structures. The plurality of IPDs is disposed on the redistribution layer, wherein the plurality of IPDs is connected to the die through the first connection structures of the redistribution layer. The plurality of ball pads is disposed on the redistribution layer and electrically connected to the redistribution layer. The plurality of solder balls is disposed on the plurality of ball pads and surrounding the plurality of IPDs, wherein the plurality of solder balls is electrically connected to the plurality of conductive pads of the die through the second connection structures of the redistribution layer. The molding compound is disposed on the redistribution layer, partially encapsulating the plurality of IPDs and the plurality of solder balls, and partially exposing the plurality of IPDs and the plurality of solder balls, wherein sidewalls of the redistribution layer and sidewalls of the molding compound are substantially aligned vertically.

In some embodiments of the present disclosure, a method of fabricating a package structure is described. A wafer is provided, the wafer comprises a first die and a second die, wherein the first die comprises a first substrate and a plurality of first conductive pads, and the second die comprises a second substrate and a plurality of second conductive pads. A redistribution layer is formed on the wafer, wherein the redistribution layer comprises first connection structures and second connection structures that are formed within a dielectric layer, and the first connection structures and the second connection structures are electrically connected to the plurality of first conductive pads and the plurality of second conductive pads. A plurality of integrated passive devices (IPDs) is disposed on the redistribution layer and the plurality of IPDs is connected to the first connection structures, wherein the plurality of IPDs is electrically connected to the first die and the second die through the first connection structures of the redistribution layer. A plurality of solder balls is disposed on the redistribution layer, wherein each of the plurality of solder balls is electrically connected to the first die or the second die through the second connection structures of the redistribution layer. A molding compound is formed on the redistribution layer and partially encapsulating the plurality of IPDs and the plurality of solder balls. A wafer dicing process is performed so as to separate the first die from the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:
providing a semiconductor wafer having a semiconductor substrate, the semiconductor wafer comprises a first die and a second die, wherein the first die comprises a first substrate and a plurality of first conductive pads, and the second die comprises a second substrate and a plurality of second conductive pads;

forming a redistribution layer on the semiconductor wafer, wherein forming the redistribution layer comprises forming first connection structures and second connection structures within a dielectric layer, and the first connection structures and the second connection structures are electrically connected to the plurality of first conductive pads and the plurality of second conductive pads;

disposing a plurality of integrated passive devices (IPDs) on the redistribution layer and physically connecting the plurality of IPDs to the first connection structures, wherein the plurality of IPDs is electrically connected to the first die and the second die through the first connection structures of the redistribution layer;

disposing a plurality of solder balls on the redistribution layer, wherein each of the plurality of solder balls is electrically connected to the first die or the second die through the second connection structures of the redistribution layer;

forming a molding compound on the redistribution layer and partially encapsulating the plurality of IPDs and the plurality of solder balls, wherein the molding compound at least expose a top surface of the plurality of IPD and top portions of the plurality of solder balls; and performing a wafer dicing process by cutting through the molding compound, the redistribution layer and cutting through the semiconductor substrate so as to separate the first substrate of the first die from the second substrate of the second die.

2. The method according to claim 1, wherein the molding compound is formed to cover the plurality of solder balls at a height no more than half of a height of the plurality of solder balls.

3. The method according to claim 1, wherein the plurality of IPDs is surrounded by the plurality of solder balls.

4. The method according to claim 3, wherein the plurality of IPDs is disposed in a central area of the package structure, and the plurality of solder balls is disposed in a peripheral area of the package structure.

5. The method according to claim 1, wherein the molding compound is formed after forming the redistribution layer, disposing the plurality of IPDs and disposing the plurality of solder balls.

6. The method according to claim 1, further comprises forming an underfill structure filled between each of the plurality of IPDs and the redistribution layer.

7. The method of fabricating the package structure according to claim 1, wherein the wafer dicing process is performed to cut through the molding compound, the redistribution layer and the wafer to allow sidewalls of the redistribution layer and sidewalls of the molding compound to be substantially aligned vertically.

8. A method of fabricating a package structure, comprising:

providing a semiconductor wafer having a semiconductor substrate, a plurality of first conductive pads, and a plurality of second conductive pads;

forming a redistribution layer on the semiconductor wafer, wherein forming the redistribution layer comprises forming a dielectric layer and forming first connection structures and second connection structures within the dielectric layer, and the first connection structures are physically and electrically separate from the second connection structures;

disposing a plurality of integrated passive devices (IPDs) on the redistribution layer and physically and electrically connecting the plurality of IPDs to the first connection structures of the redistribution layer;

disposing a plurality of solder balls on the redistribution layer and physically and electrically connecting the plurality of solder balls to the second connection structures of the redistribution layer;

forming a molding compound on the redistribution layer and partially encapsulating the plurality of IPDs and the plurality of solder balls; and performing a wafer dicing process by cutting through the molding compound, through the redistribution layer and through the semiconductor substrate to form a plurality of packages, wherein sidewalls of the redistribution layer, sidewalls of the molding compound and sidewalls of the semiconductor substrate of the plurality of packages are substantially aligned vertically after the wafer dicing process.

9. The method according to claim 8, wherein a height of the molding compound is less than or equivalent to a half of a height of the plurality of solder balls.

10. The method according to claim 8, wherein the plurality of IPDs includes at least two types of IPDs selected from a capacitor, an inductor, a resistor and an antenna.

11. The method according to claim 8, further comprises forming an underfill structure filled between the plurality of IPDs and the redistribution layer.

12. The method according to claim 8, wherein the plurality of IPDs is disposed in a central area of the package structure, and the plurality of solder balls is disposed in a peripheral area of the package structure surrounding the central area.

13. A semiconductor die structure, comprising:

a semiconductor substrate and a plurality of conductive pads formed on the semiconductor substrate;

a dielectric layer disposed on the semiconductor substrate and in physical contact with the semiconductor substrate;

first connection structures and second connection structures located on a same surface of the semiconductor substrate and inlaid within the dielectric layer, wherein the first connection structures and the second connection structures are physically and electrically connected to the plurality of conductive pads, and the dielectric layer physically separates the first connection structures from the second connection structures;

at least one integrated passive device (IPD), disposed on the dielectric layer and electrically connected to the plurality of conductive pads, wherein the first connection structure physically contacts the at least one IPD and the plurality of conductive pads and connects the at least one IPD and the plurality of conductive pads, and the first connection structure provides a direct electrical connection route connecting the at least one IPD to the plurality of conductive pads;

a plurality of ball pads, disposed on the dielectric layer, wherein the plurality of ball pads is electrically and physically connected to the second connection structures;

a plurality of solder balls, disposed on the plurality of ball pads, wherein the plurality of the solder balls is disposed on and physically connected to the plurality of ball pads, and being electrically connected to the second connection structures through the plurality of ball pads; and an encapsulating material, disposed on the dielectric layer and in physical contact with the dielectric layer, wherein the encapsulating material partially encapsulates the at least one IPD and the plurality of solder balls and exposes top portions of the plurality of solder balls and a top surface of the at least one IPD, and sidewalls of the dielectric layer, sidewalls of the encapsulating material and sidewalls of the semiconductor substrate are substantially aligned vertically.

14. The semiconductor die structure according to claim 13, wherein a height of the encapsulating material is less than or equivalent to a half of a height of the solder balls.

15. The semiconductor die structure according to claim 13, wherein the dielectric layer is located in between the semiconductor substrate and the encapsulating material.

16. The semiconductor die structure according to claim 13, wherein the plurality of solder balls surround the at least one IPD.

17. The semiconductor die structure according to claim 16, wherein the at least one IPD is disposed in a central area of the semiconductor die structure, and the plurality of solder balls are disposed on a peripheral area of the semiconductor die structure surrounding the at least one IPD.

18. The semiconductor die structure according to claim 13, wherein the semiconductor die structure comprises at least two types of IPDs selected from a capacitor, an inductor, a resistor and an antenna.

19. The semiconductor die structure according to claim 13, further comprising an underfill structure, wherein the underfill structure is filled in between the IPD and the dielectric layer.

* * * * *